United States Patent [19]

Proebsting

[11] 4,291,392

[45] Sep. 22, 1981

[54] TIMING OF ACTIVE PULLUP FOR DYNAMIC SEMICONDUCTOR MEMORY

[75] Inventor: Robert J. Proebsting, Dallas, Tex.

[73] Assignee: Mostek Corporation, Carrollton, Tex.

[21] Appl. No.: 119,292

[22] Filed: Feb. 6, 1980

[51] Int. Cl.³ .............................................. G11C 7/00
[52] U.S. Cl. .................................... 365/203; 365/204
[58] Field of Search ................ 365/149, 203, 204, 205

[56] References Cited

U.S. PATENT DOCUMENTS

| | | | |
|---|---|---|---|
| 3,765,002 | 10/1973 | Basse ................................... | 365/204 |
| 3,965,460 | 6/1976 | Barbara .............................. | 365/204 |
| 4,070,590 | 1/1978 | Ieda et al. .......................... | 365/203 |
| 4,168,490 | 9/1979 | Stinehelfer ......................... | 365/204 |

Primary Examiner—Stuart N. Hecker

[57] ABSTRACT

A method for operating a dynamic semiconductor memory circuit (10) having a memory cell (12) which comprises a access transistor (12a) connected to a half digit line (18) and a storage capacitor (12b). Each of the half digit lines (18, 22, 60 and 62) is charged or discharged as a result of either read operations carried out with the corresponding memory cells or write operations receiving incoming data states through input/output lines (42, 46). The charged state of the half digit line (18, 22, 60 and 62) is at a voltage substantially below that of the supply voltage of the circuit (10). After the half digit lines (18, 22, 60 and 62) are sensed and/or written to the desired states, a pullup circuit (48) for each of the half digit lines (18, 22, 60 and 62) charges the half digit lines with voltages above a predetermined threshold to the full supply voltage. A word line signal (72) couples the charge storage capacitor (12b) to the corresponding half digit line (18) to transfer the full supply voltage of the circuit (10) into the storage capacitor (12b).

5 Claims, 4 Drawing Figures

4,291,392

TIMING OF ACTIVE PULLUP FOR DYNAMIC SEMICONDUCTOR MEMORY

TECHNICAL FIELD

The present invention pertains to dynamic semiconductor memory circuits and in particular to the timing of the active pullup operation within such a circuit.

BACKGROUND ART

In a dynamic semiconductor memory circuit, each memory cell includes a storage capacitor which is charged to one of two voltage states which correspond to binary information. The charge on the storage capacitor has a short life time due to leakage within the cell. The charge must be periodically refreshed to maintain the data pattern stored in the memory. Reading the memory cell comprises connecting the storage capacitor to a digit line so that the charge stored on the capacitor is transferred to the digit line. The transfer of charge causes the voltage on the digit line to be changed by a few tenths of a volt, and this voltage change is detected by a sense amplifier which makes a comparison to the voltage on a complementary half of the digit line. The ability to correctly read the charge stored on the storage capacitor is dependent upon the voltage on the capacitor at the time that it is read. To insure the greatest accuracy in storing data, it is important to initially charge the storage capacitor to the highest possible voltage. In an MOSFET (metal oxide semiconductor field effect transistor) memory circuit it is most desirable to use a single +5 volt voltage supply. When using the one supply, it is therefore important that when storing the information represented by the high voltage state, the full 5.0 volts be applied to the memory cell.

Heretofore dynamic RAM (Random Access Memory) circuits have utilized digit lines which are charged by driving circuitry to substantially the supply voltage to place a high voltage level into a memory cell. But due to the resistance and capacitance of the digit line and corresponding input/output line, a substantial time is required to charge the digit line to approximately the supply voltage. There is an increasing demand for memory circuits which have faster operating cycles and the process described above for charging digit lines is inherently slow and as such cannot meet the demand for greater speed.

In view of the above problems, there exists a need for a method of operating a dynamic integrated circuit semiconductor memory in such a manner that the full supply voltage can be supplied to the storage capacitors within the memory cells without the need for driving the digit lines to the supply voltage.

DISCLOSURE OF THE INVENTION

A method is described for writing data into a memory cell of a dynamic semiconductor memory circuit comprising the steps of first driving a half digit line corresponding to the memory cell to at least a first voltage in response to an external command to write data into the memory cell. The first voltage is less than the supply voltage for the memory circuit. The next step comprises activating a pullup circuit after the half digit line has been driven to at least the first voltage to elevate the voltage on the half digit line to approximately the supply voltage.

BRIEF DESCRIPTION OF THE DRAWING

For a more complete understanding of the present invention and the advantages thereof, reference is now made to the following Description taken in conjunction with the accompanying Drawings in which.

DETAILED DESCRIPTION

Figure 1:
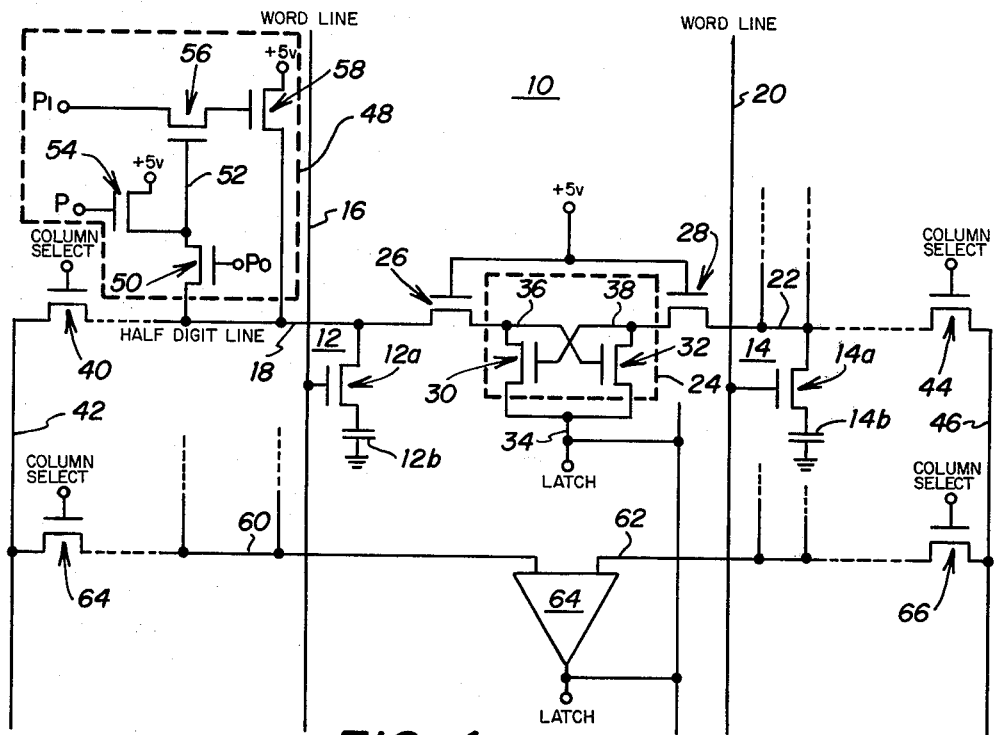
FIG. 1 is a schematic diagram illustrating the various circuits in a dynamic semiconductor memory which are relevant to the method of the present invention.

The present invention relates to the operation of a dynamic integrated circuit semiconductor memory fabricated using MOSFET technology. Referring to FIG. 1, there are illustrated representative circuits which are utilized in a semiconductor memory and are operated in accordance with the method of the present invention. Memory circuit 10 has a plurality of memory cells for storing data therein. Memory cells 12 and 14 are representative of the plurality of memory cells included within the overall circuit. Memory cell 12 includes an access transistor 12a and a storage capacitor 12b. The gate terminal of transistor 12a is connected to a word line 16 and the drain terminal of transistor 12a is connected to a half digit line 18. The source terminal of transistor 12a is connected to a first terminal of the capacitor 12b and the second terminal of the capacitor 12b is connected to ground. The memory cell 14 likewise has an access transistor 14a and a storage capacitor 14b. The gate terminal of transistor 14a is connected to a word line 20 and the drain terminal of transistor 14a is connected to a half digit line 22. A full digit line within circuit 10 comprises a complementary pair of half digit lines such as 18 and 22.

Each digit line in circuit 10 is split into half digit lines, with each half digit line connected to one input of a sense amplifier, such as amplifier 24. Half digit line 18 is connected to amplifier 24 through a transistor 26, and half digit line 22 is connected to amplifier 24 through a transistor 28. The drain and source terminals of transistors 26 and 28 interconnect the half digit lines 18 and 22 to the sense amplifier 24. The gate terminals of transistors 26 and 28 are connected to the 5.0 volt supply voltage.

Sense amplifier 24 comprises a pair of transistors 30 and 32 which have the source terminals thereof connected together and joined to a latch node 34. The drain terminal of transistor 30 is connected to a node 36 which is also connected to transistor 26 and the gate terminal of transistor 32. The drain terminal of transistor 32 is connected to a node 38 which is connected to transistor 28 and to the gate terminal of transistor 30.

Each of the half digit lines is connected to a column select transistor which is operated to selectively connect the half digit line to its respective input/output line. In circuit 10, half digit line 18 can be connected through column select transistor 40 to an input/output line 42. Half digit line 22 can be connected through a column select transistor 44 to an input/output line 46. The column select transistors are activated by a column select signal which is produced by decoder circuits (not shown) in response to an address signal.

Each of the half digit lines in circuit 10 is provided with a pullup circuit that corresponds to pullup circuit 48. Pullup circuit 48 includes a transistor 50 which has the source terminal thereof connected to half digit line 18 and the drain terminal thereof connected to a node 52. The gate terminal of transistor 50 is connected to receive a $P_0$ signal which is shown in FIG. 2. A transistor 54 has the source terminal thereof connected to node 52 and the drain terminal thereof connected to the +5 volt supply voltage. The gate terminal of transistor 54 is connected to receive the P signal as shown in FIG. 2. A transistor 56 has the gate terminal thereof connected to node 52 and the drain terminal thereof connected to receive signal $P_1$ which is shown in FIG. 2. The source terminal of transistor 56 is connected to the gate terminal of a transistor 58 which has the drain terminal thereof connected to the +5 volt voltage supply. The source terminal of transistor 58 is connected to the half digit line 18. Each of the pullup circuits serves to monitor the voltage on the corresponding half digit line and elevate the voltage thereon if it is above to predetermined threshold.

Circuit 10 comprises an array of digit lines and word lines and a second group of half digit lines are illustrated to indicate the repetitive layout of the circuit. Half digit lines 60 and 62 are connected to the inputs of a sense amplifier 64 which is structurally the same as amplifier 24 described above. Amplifier 64 includes a latch terminal which is connected to node 34. Half digit line 60 is connected through a column select transistor 64 to the input/output line 42 and half digit line 62 is connected through a column select transistor 66 to the input/output line 46. As noted above, each of the half digit lines, including 60 and 62, have connected thereto a pullup circuit such as circuit 48 described above.

Figure 2A:
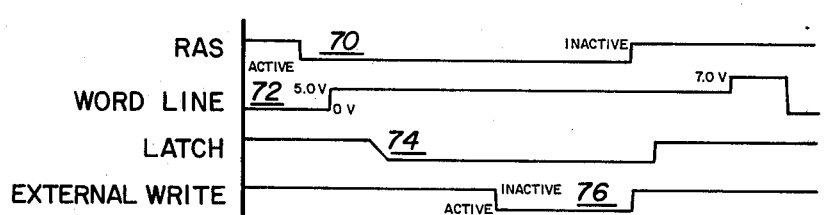
FIGS. 2A–2C illustrations of various timing and control signals utilized in the circuit shown in FIG. 1.
Figure 2B:
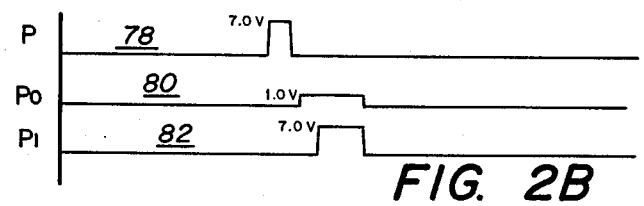
Figure 2C:
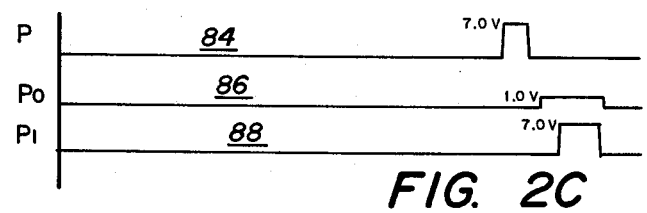

Referring now to FIGS. 2A, 2B and 2C, there are illustrated the various control and timing signals which are utilized in the circuit shown in FIG. 1. The signals in FIGS. 2A, 2B and 2C are generated by circuitry not shown herein but widely implemented in the industry for producing these signals. In FIG. 1 there is shown a RAS (Row Address Strobe) signal 70, a word line signal 72, a latch signal 74 and an external write signal 76.

In FIG. 2B there are illustrated a group of pullup circuit timing signals as heretofore used in semiconductor memory circuits. These include a P signal 78, a $P_0$ signal 80 and a $P_1$ signal 82.

In FIG. 2C there are illustrated a group of pull up circuit timing signals as utilized in the method of the present invention. These include a P signal 84, a $P_0$ signal 86 and a $P_1$ signal 88.

The operation of the semiconductor memory circuit is now described in reference to FIGS. 1, 2A, 2B and 2C. A typical read operation for circuit 10 proceeds as follows. The RAS signal 70 is externally supplied to the circuit 10 along with a row address. The RAS signal 10 causes the row address to be decoded and generate the word line signal 72 which is applied to one of the word lines within the memory circuit 10. The word line signal 72 can, for example, be applied to word line 16. When the word line signal transitions from the 0 to 5.0 volt level, the access transistor 12a will be turned on thereby coupling the storage capacitor 12b to the half digit line 18. In a previous sequence of operations, the half digit lines 18 and 22 have been equilibrated to have very closely the same voltage on the two lines. This is generally about 2.0 volts. If the storage capacitor 12b is initially charged to 5.0 volts, its connection to line 18 will cause the half digit line 18 to be elevated in voltage by a few tenths of a volt since the capacitance of line 18 is ten to twenty times that of capacitor 12b. Line 18 is thus elevated to approximately 2.2 volts for an initial 5.0 volt charge on capacitor 12b. If capacitor 12b has an initial 0.0 volt charge, line 18 will be pulled down to a voltage of approximately 1.8 volts.

The circuit 10 is constrained to operate in such a manner that only one memory cell is read out on a digit line at any one given time. Thus, when a memory cell is being read on half digit line 18, there will be no memory cell read on half digit line 22. After a memory cell has been connected to a half digit line, the latch line signal 74 is applied to the latch node 34 to operate the sense amplifiers for each digit line. Referring to sense amplifier 24, the voltage at the source terminals of transistors 30 and 32 is pulled down at the negative transition of the latch signal 74. Since one of the half digit lines will have a higher voltage on it than the other half digit line, if the latch signal 74 makes its negative transition slowly enough, only one of the transistors 30 and 32 will be turned on to discharge the corresponding half digit line. The gate to source bias on the remaining transistor will remain low therefore preventing that transistor from being turned on. The result is that the half digit line with the lower initial voltage is discharged through one of transistors 30 and 32 to the latch node until that half digit line is brought to ground. This operation occurs with each of the sense amplifiers in each of the digit lines in the circuit 10.

After the latch signal 74 has made its downward transition, one of the half digit lines will be at approximately 2 volts and the other half digit line will be at ground. In the memory circuits utilized heretofore, the immediate following step is the operation of the pull-up circuit 48 under the control of the signals shown in FIG. 2B. Circuit 48 operates as follows in response to the signals shown in FIG. 2B. Upon receipt of the P signal 78, transistor 54 is turned on to precharge node 52 to a 5.0 volt level. Node 52 is charged to the full supply voltage because the drive signal 78 on the gate terminal of transistor 54 is at a 7.0 volt level, at least one threshold voltage above the 5.0 volt supply. When the P signal 78 makes a downward transition, it turns off transistor 54 and isolates node 52 with the 5.0 volt charge thereon. Following this action, $P_0$ signal 80 is applied to the gate terminal of transistor 50. If the half digit line 18 is at a voltage of more than approximately 1.0 volts, the transistor 50 will not be turned on due to insufficient gate to source potential. When this occurs, the charge on node 52 is not affected by the signal 80. When the $P_1$ signal 82 makes the transition from low to high, transistor 56 in turned on due to both the residual charge left on node 52 and the capacitive coupling of signal 82 into node 52. Node 52 is elevated to approximately 9.0 volts due to the capacitive coupling between the channel of transistor 56 and its gate, node 52. Due to the elevated voltage on the gate terminal of transistor 56, the full 7.0 volt potential of signal 82 is applied to the gate terminal of transistor 58. This turns on transistor 58 and connects half digit line 18 to the full 5.0 volt supply voltage. In this manner, line 18 is charged to the full potential of the supply voltage of circuit 10. The preferred voltage on a half digit line to cause that line to be pulled to the full supply voltage is in the range of 1.0 to 4.0 volts.

If, on the other hand, half digit line 18 were at ground potential after node 52 is precharged to 5.0 volts, transistor 50 will be turned on by the operation of $P_0$ signal 80. When transistor 50 is turned on, node 52 will be discharged through transistor 50 into line 18. Node 52 will thus be pulled to ground potential. When the $P_1$ signal 82 is subsequently applied to transistor 56, the gate terminal of transistor 56 can not be elevated in potential due to capacitive coupling because node 52 is being held at ground. Due to the discharge of node 52 and the lack of capacitive coupling, transistor 56 will not be turned on by the operation of signal 82. Since no voltage is then transmitted to the gate terminal of transistor 58, it likewise will not be turned on and the supply voltage will not be connected to half digit line 18. As can be seen from the above description, the pullup circuit 48 serves to elevate the voltage on each half digit line if the voltage on that line is above a preset threshold, such as the 1.0 volt threshold described above, and does not affect the half digit line which is previously pulled to ground by operation of the sense amplifiers.

In the conventional sequence, the pullup timing is that shown in FIG. 2B where the half digit line is either elevated to the supply potential or not affected at the time immediate following the operation of the sense amplifier. If the external write signal 76 is not applied to circuit 10, the pullup operation will complete the memory cycle and restore the original charge to the storage capacitors in the memory cells due to the operation of the word line 72 which is elevated to a 7.0 volt level to fully couple the supply voltage or ground voltage as required into the storage capacitors.

But in many operations, the memory cycle includes the step of writing a new state into the selected memory cell after the read operation has been completed. With the timing of FIG. 2B, the read operation includes the pullup sequence. If the write operation should require a high voltage state on a half digit line that previously contained a low voltage, some means must be provided for driving the half digit line to a full 5.0 volts in order to have a full supply voltage provided to the selected storage capacitor. One method for doing this comprises applying a full supply voltage input signal, such as 5.0 volts, to the input/output lines 42 or 46 while at the same time providing an elevated voltage signal, such as 7.0 volts, to the gate terminal of the column select transistor connected to the desired half digit line. These two steps would provide the full 5.0 volt signal level to the half digit line, however, it would be expensive in terms of power consumption and circuit complexity to provide circuitry that would generate this elevated voltage level. Moreover a relatively long time is required to bring the half digit line up to the full supply voltage. Therefore, such a solution to the problem is not desirable.

An alternative approach would be to initiate additional pullup operations after the conventional pullup operation to elevate the voltages on the half digit lines that have received new data. This procedure, however, would require additional sequencing circuitry and would serve to slow down each memory cycle due to the numerous additional operating steps which would be required.

The present invention provides a method for resolving this difficulty without the need for additional circuitry or increasing the time period of the memory cycle. This is provided by substituting the timing sequence shown in FIG. 2C for that shown in FIG. 2B for the pullup operation. Basically, the pullup operation is delayed until after the external write sequence has been completed. In the method of the present invention, the half digit lines are acted upon by the sense amplifiers during the sensing operation and may be subsequently charged to nominal levels by the input/output circuitry during a write operation. These operations occur before the pullup operation is initiated. The pullup operation then charges the half digit lines at or above 2 volts to the full supply voltage. The pull up operation simultaneously elevates the voltages due to read operations as well as those due to newly supplied write operations.

The method of the present invention is described below in reference to FIGS. 1, 2A and 2C. The portion of the read operation involving the sense amplifier function is the same as that described above. However, after the sense amplifiers have pulled one of the half digit lines to ground, the write operation may occur in which case an input signal on the order of 2.0 or more volts is supplied through the input-output lines 42 or 46. This signal is transferred through the column select transistors by driving the gate terminals of these transistors with a 5.0 volt signal. Thus, an elevated gate terminal voltage on the column select transistors is not needed with the present invention. The half digit line connected thereto is charged to at least 2.0 volts if it is desired to store a high level signal in the corresponding memory cell. After the write operation to the half digit lines has been completed, the pullup operation, as shown by the signals in FIG. 2C, is initiated to elevate the voltages on the half digit lines having an initial voltage above approximately 2.0 volts. Each of these half digit lines is pulled up to the full supply voltage by operation of the pullup circuit in the manner described above.

The circuit 10 then can also be operated in a page mode wherein a plurality of memory cells along a word line are read and/or written during a single extended period of the RAS signal 70. Once a word line has been activated, all of the memory cells along that line will be connected to the respective half digit lines. In order to read or write a signal into a memory cell, it is only required that a column address input signal be supplied and the corresponding column select transistor be turned on. The action of turning on a column select transistor is much faster than the entire sequence of connecting a memory cell to a half digit line followed by operation of the sense amplifier and pullup circuit. Since each of the half digit lines can be accessed separately through the column select transistors, a plurality of bits can be read or written during a single RAS period. With the present invention a single pullup operation will occur after all of the write operations have occurred. Therefore, each write operation can be completed very quickly since it needs only to drive the half digit line to about 2 volts while using a 5 volt supply.

In other techniques, page mode operation has required that a word line, such as line 16, be held at an elevated voltage during each of the column select operations in order to write data into a cell. The process of driving the word line to an elevated voltage above that of the supply voltage can be accomplished for a short period of time but can be extremely difficult if it is necessary to hold the word line at the elevated potential for an extended period of time. If the write operation were carried out in the page mode under the pre-existing technique, it would be necessary to hold the word line at the elevated voltage for an extended period of time. But, with the present invention, the word line need be elevated to the 7.0 volt level for only a short period after the last of the write operations has been completed, as indicated by initiation of the inactive portion of the memory cycle as shown by the positive transition of the RAS input signal, 70. During this very short period, all the access transistors are turned on along a word line and the voltages on the half digit lines are transferred into the storage capacitors.

A particular advantage with operation of the present invention is the speed at which the incoming data can be transferred into the half digit lines. If the half digit lines must be driven to the 5.0 volt supply level by the input lines, the input lines must be connected to the half digit lines for an extended period of time. This period of time is equal to several time constants for the resistive and capacitive combination of the column select transistor resistance and corresponding half digit line capacitance. But, if the half digit line need only be charged to approximately 2.0 volts still using a 5.0 volt supply, the transfer of data from the input lines to the half digit lines can be carried out in a period of time that is less than one time constant.

The advantages of operating a dynamic semiconductor memory circuit in the method described above for the present invention are as follows:

1. There is no critical or elevated voltage required on the input lines.

2. No elevated voltage is required to drive the gate terminals of the column select transistors.

3. The write operation is made extremely fast since charging the half digit lines to a 2.0 volt level is much faster than charging them to a 5.0 volt level.

4. Page mode write operation is speeded up since only the basic step of activating the column select transistor is required for each memory cell, and a single pullup operation is utilized for the whole memory following a complete series of page mode write operations.

5. There is no requirement to hold a word line at an elevated voltage for any extended period of time during the page mode operation.

A preferred range of operation for the incoming signals on the input/output lines is in the range of 2 to 4 volts and this voltage is transferred to the half digit lines.

Although only one embodiment of the invention has been illustrated in the accompanying drawings and described in the foregoing detailed description, it will be understood that the invention is not limited to the embodiment disclosed, but is capable of numerous rearrangements, modifications and substitutions without departing form the scope of the invention.

I claim:

1. A method for writing data into a memory cell of a dynamic semiconductor memory circuit comprising the steps of:

driving a digit line associated with the memory cell to at least a first voltage in response to an external command to write data into the memory cell, said first voltage less than the supply voltage for the memory circuit;

activating a pullup circuit after said digit line has been driven to at least said first voltage, to elevate the voltage on said digit line to approximately said supply voltage; and coupling said digit line to the memory cell to charge the memory cell to approximately said supply voltage.

2. The method recited in claim 1 wherein the step of driving a digit line to at least a first voltage comprises the steps of:

driving an input/output line to at least said first voltge; and connecting said input/output line to said digit line.

3. The method recited in claim 1 wherein the step of activating a pullup circuit comprises the steps of:

charging a first node to a preselected voltage in responce to a first signal;

discharging said first node to a low voltage state in response to a second signal following said first signal when said digit line is at less than a predetermined voltage; and charging said digit line to approximately said supply voltage through a transistor activated in response to a third signal which follows said second signal when the voltage on said first node is at approximately said preselected voltage.

4. In a dynamic semiconductor memory circuit having a nominal 5 volt supply voltage, a method for charging a storage capacitor in a memory cell to the full supply voltage wherein the storage capacitor is connectable through an access transistor to a digit line and an input/output line is connectable to the half digit line through a column select transistor, comprising the steps of:

driving the input/output line to at least 2.0 volts in response to an externally supplied write command;

connecting the input/output line to the digit line to charge the digit line to approximately the voltage on the corresponding input/output line;

activating a pullup circuit connected to the digit line to charge the digit line to approximately 5 volts when the digit line has been charged to a voltage in the range of 1 to 4 volts; and activating the access transistor during activation of said pullup circuit, to connect the storage capacitor to the digit line and thereby charge the storage capacitor to approximately 5 volts.

5. In a dynamic semiconductor memory circuit wherein a plurality of memory cells are accessed through a common word line and each memory cell transfers data through a corresponding digit line, a method for page mode writing data states to the memory cells, comprising the steps of:

sequentially driving a plurality of the digit lines to one of two predetermined voltage states, the voltage state corresponding to the data state to be entered into the memory cell connected to the corresponding digit line, subsequent to driving the digit line to one of the two predetermined voltage states, activating pullup circuits connected to the digit lines to simultaneously elevate to the supply voltage of the circuit the digit lines which were charged to more than a preset voltage, and coupling the digit lines to the corresponding memory cells to charge the memory cells to the voltage states on the digit lines.

* * * * *